United States Patent [19]

Gardner et al.

[11] Patent Number: 5,001,609
[45] Date of Patent: Mar. 19, 1991

[54] NONIMAGING LIGHT SOURCE

[75] Inventors: Robert C. Gardner; David E. Silverglate; Greg P. Smestad; George E. Smith, all of San Jose; John F. Snyder, Sunnyvale, all of Calif.

[73] Assignee: Hewlett-Packard Company, Palo Alto, Calif.

[21] Appl. No.: 254,349

[22] Filed: Oct. 5, 1988

[51] Int. Cl.$^5$ ................................................ F21V 7/09
[52] U.S. Cl. ...................... 362/32; 362/297; 362/346; 362/347; 362/800; 357/17; 357/70
[58] Field of Search ............... 357/17, 69, 70; 362/32, 362/297, 298, 302, 346, 347, 800, 336, 337, 338, 339

[56] References Cited

U.S. PATENT DOCUMENTS

| | | | |
|---|---|---|---|
| 3,609,475 | 9/1971 | Kaposhilin | 313/108 D |
| 3,780,357 | 12/1973 | Haitz | 313/108 D |
| 3,821,775 | 6/1974 | Biard | 357/17 |
| 3,875,456 | 4/1975 | Kano et al. | 357/17 X |
| 3,923,381 | 12/1975 | Winston | 350/293 |
| 3,957,031 | 5/1976 | Winston | 350/293 |
| 4,002,499 | 1/1977 | Winston | 250/228 |
| 4,003,638 | 1/1977 | Winston | 350/293 |
| 4,045,246 | 8/1977 | Miavsky | 126/270 |
| 4,114,592 | 9/1978 | Winston | 350/293 |
| 4,130,107 | 12/1978 | Rabl et al. | 350/293 |
| 4,230,095 | 10/1980 | Winston | 350/293 |
| 4,237,332 | 12/1980 | Winston | 136/259 |
| 4,240,692 | 12/1980 | Winston | 126/438 |
| 4,359,265 | 11/1982 | Winston | 350/246 |
| 4,387,961 | 6/1983 | Winston | 350/296 |
| 4,483,007 | 11/1984 | Winston | 372/72 |
| 4,651,261 | 3/1987 | Szekacs | 362/336 X |
| 4,684,919 | 8/1987 | Hihi | 362/307 X |
| 4,698,730 | 10/1987 | Sakai et al. | 362/800 X |
| 4,742,432 | 5/1988 | Thillays | 362/800 X |

FOREIGN PATENT DOCUMENTS

| | | | |
|---|---|---|---|
| 6045452 | 9/1983 | Japan . | |
| 197806 | 6/1978 | Netherlands | 362/800 |

OTHER PUBLICATIONS

Von M. Ploke, Carl Zeiss; "Lichtfuhrungseinrichtungen mit starker Konzeutrationswirkung", 10/1967.
X. Ning, R. Winston, J. O'Gallagher; "Dielectic totally internally reflecting concentractors", Applied Optics, 15 Jan. 1987, p. 300-305.
"Aperture without Restricting Angular Acceptance", The Enrico Fermi Institute, Apr. 8, 1968.
H. Hinterberger and R. Winston, "Efficient Light Coupler for Threshold Cerenkov Counters,", Enrico Fermi Institute, Mar. 1, 1966, pp. 1094-1095.

Primary Examiner—Stephen F. Husar
Assistant Examiner—Peggy A. Neils

[57] ABSTRACT

The principles of non-imaging optics, rather than imaging optics, are used to provide a high power LED illumination lamp that has a specified limited viewing angle. A compound parabolic flux extractor extracts and concentrates light emitted by an LED chip and a light pipe continues the concentration into the specified viewing angle. A lens or a diffusant may be used to modify the light output of the lamp. A light constructed as an array of the lamps is suitable for use as an automobile external light such as a center high mounted stop light.

21 Claims, 9 Drawing Sheets

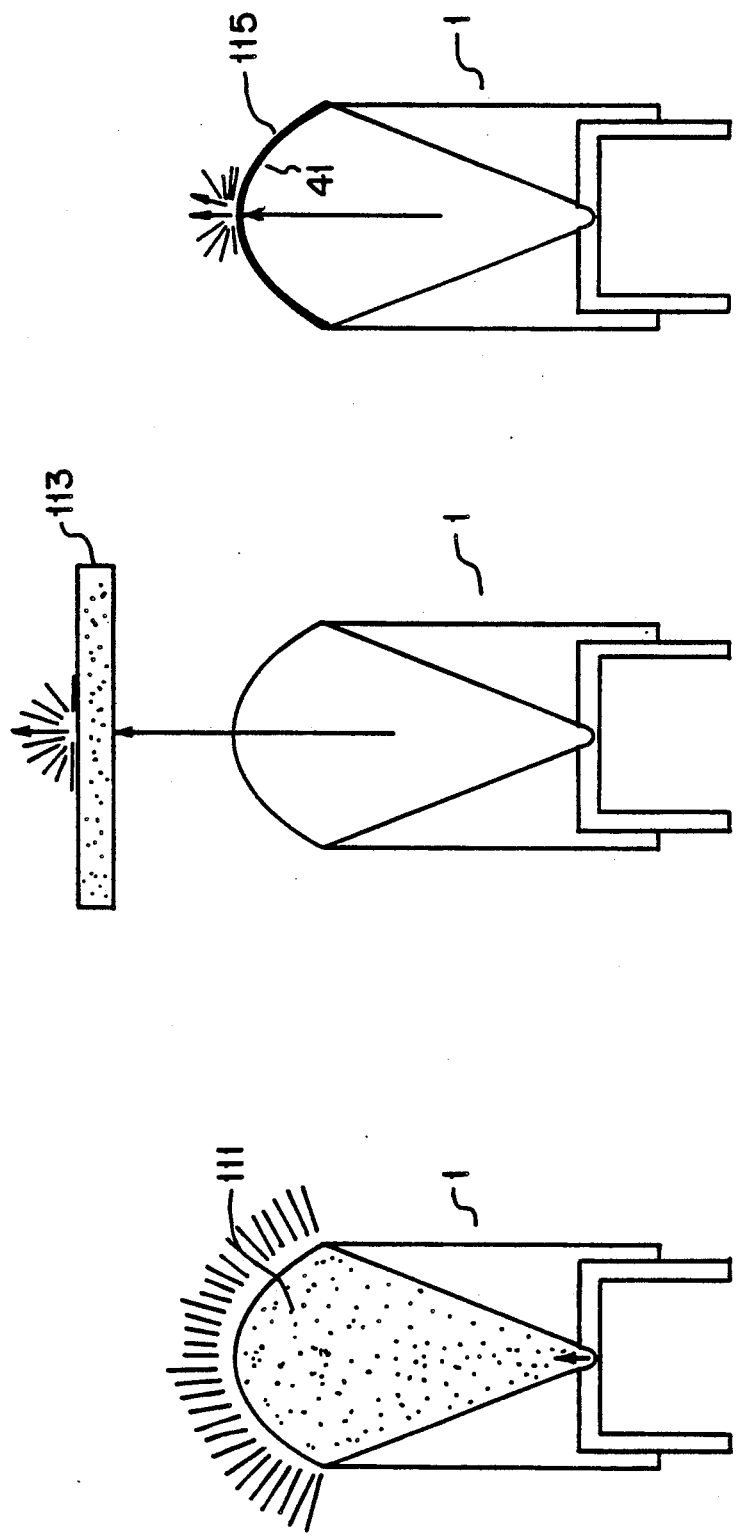

NONIMAGING LIGHT SOURCE

BACKGROUND AND SUMMARY OF THE INVENTION

Light emitting diodes (LEDs) are becoming increasingly widely used in automobile design because of their longer lives and lower cost compared to the incandescent bulbs they replace. Present day automotive designers are specifying LEDs not only for indicator lamps and alphanumeric digits but also for high power illumination lamps such as center high mounted stop lights. LED stop lights require very high brightness, but often only over a very limited viewing angle. FIG. 1 shows the current U.S. federal standard for LED center high mounted stop light brightness in candela as a function of viewing angle.

In order to be cost competitive with incandescent bulbs, an LED stop light must contain only a minimum number of individual LED lamps. The number of individual lamps can only be minimized if each lamp extracts substantially all of the light flux from the LED chip and concentrates the light within the useful viewing angle. Light flux outside of the viewing angle is wasted and might have been available to increase brightness within the viewing angle. Commercially available indicator lamps, which are designed according to the principles of imaging optics and standard manufacturing techniques, fail to concentrate sufficient light flux within the narrow required viewing angle. The imaging optics design constraint that the emitting surface is imaged onto the viewing plane makes design of a cost effective LED illumination lamp using imaging optics very difficult.

An alternative design approach known as non-imaging optics has been used successfully in the design of high efficiency solar collectors An additional degree of design freedom is available in non-imaging optics since there is no requirement that the emitting surface be imaged onto the viewing plane. An informative discussion of non-imaging optics may be found in the textbook "The Optics Of Nonimaging Concentrators" by W. T. Welford and R. Winston Specific examples of the use of non-imaging optics in solar collectors may be found in the U.S. patents (e.g., U.S. Pat. Nos. 3,923,381 and 3,957,031) issued to Dr. Roland Winston.

In accordance with the illustrated preferred embodiments of the present invention, the inventors have used the concepts of non-imaging optics to provide a high efficiency LED illumination lamp that is well adapted for use in an external automobile light such as a stop light. The lamp, which produces a very bright output over a preselected limited viewing angle, consists of two primary stages plus an optional lens stage. The first stage is a flux extractor which supports the LED and concentrates the three dimensional light flux into a desired angle, such as ±45°, relative to the optical axis. The second stage is a light pipe which continues the concentration to a final desired viewing angle. By using this second stage, instead of continuing the flux extractor's compound parabolic shape, the inventors have greatly simplified manufacturing and improved the cost and reliability of the lamp. One of a number of lenses may be used to increase the apparent illuminated area of the lamp or to allow a decrease in the physical height of the lamp.

In an alternative preferred embodiment of the present invention, a diffusant may be used to scatter the LED light. A bulk diffusant may be located within the structure of the lamp itself or a diffusing layer may be positioned over the lamp. The diffusant operates to increase the apparent size of the illuminated area, to decrease the brightness of the lamp and to increase the flux divergence to an approximately Lambertian distribution at the diffusant surface.

BRIEF DESCRIPTION OF THE DRAWINGS

FIGS. 8A-C show the use of diffusant with the lamp shown in FIG. 4.

DETAILED DESCRIPTION OF THE PREFERRED EMBODIMENTS

Figure 1:
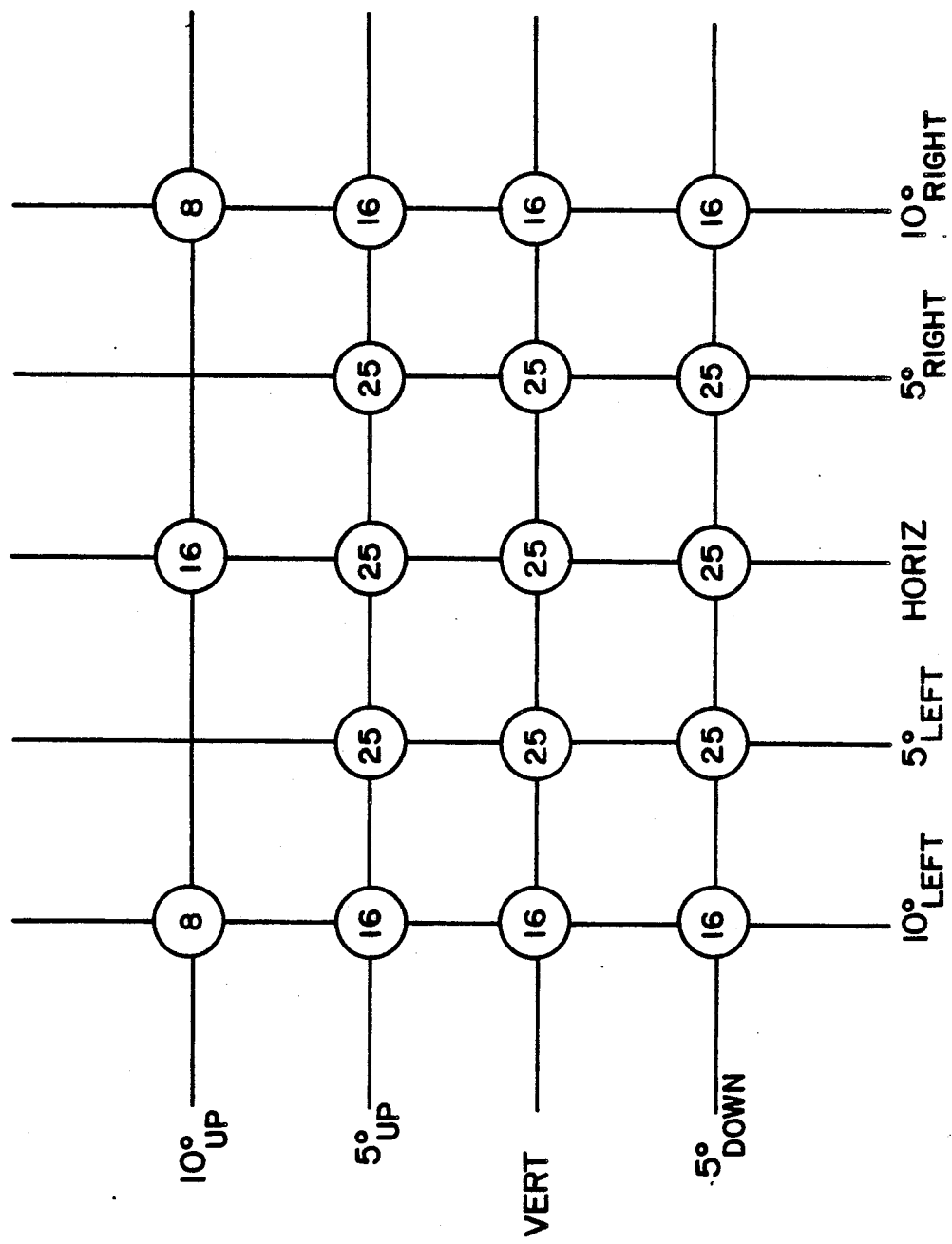
FIG. 1 shows the U.S. federal specification for the brightness of an LED automobile center high mounted stop light as a function of viewing angle.

FIG. 1 shows the current U.S. federal specification for the brightness, in candela, of an LED automobile center high mounted stop light as a function of horizontal and vertical viewing angle. The required brightness is at a maximum within 5° of the optical axis and decreases as the angle increases. Light flux beyond 10° above the optical axis, 5° below the optical axis, or 10° to either side of the optical axis is not required and is, therefore, wasted.

Figure 2:
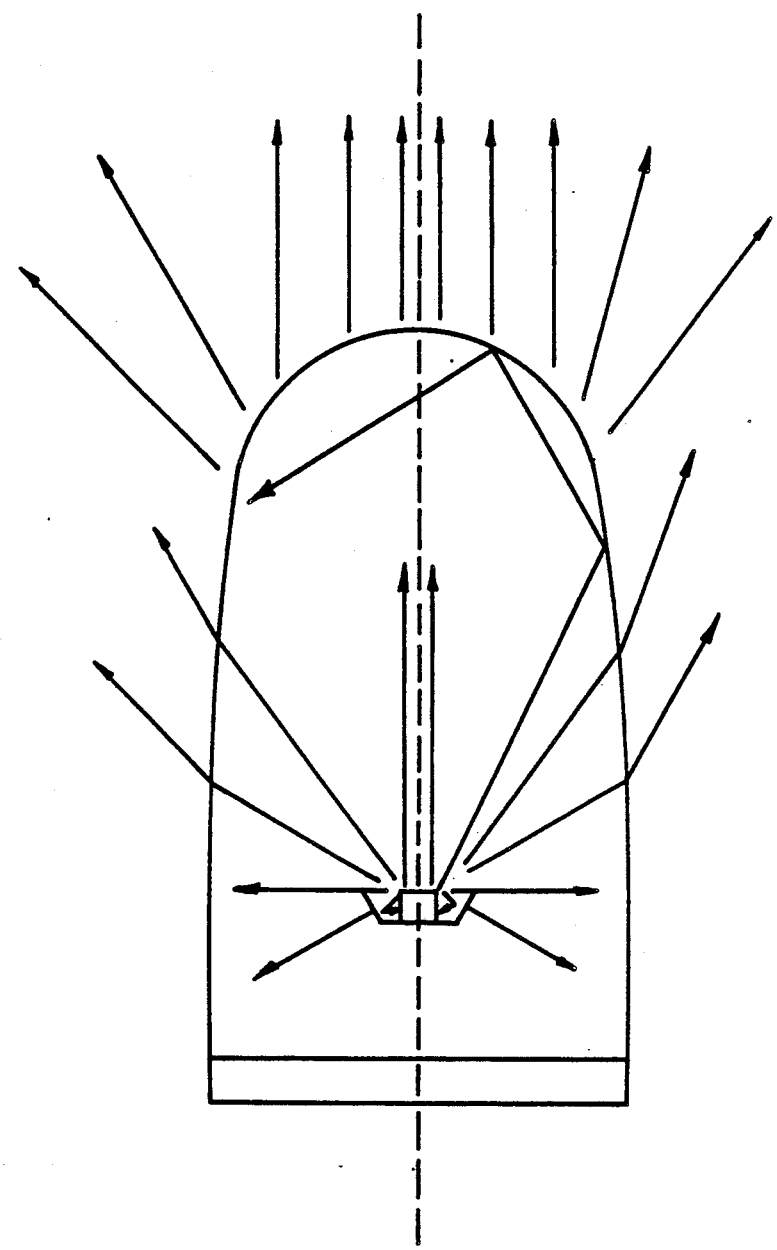
FIG. 2 shows a prior art LED lamp designed according to the principles of imaging optics
Figure 3:
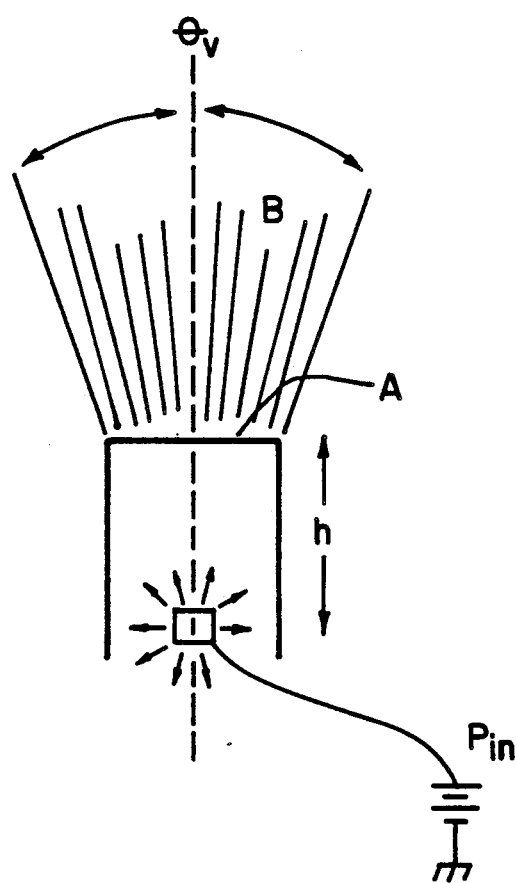
FIG. 3 shows various design parameters that are important to the design of an LED illumination lamp.

FIG. 2 shows a schematic cross section of a prior art LED indicator lamp, such as the Hewlett-Packard Company model HLMP-3570 ultrabright LED lamp, that is constructed according to the principles of imaging optics. Since this device is not optimized for extracting and concentrating a maximum amount of light flux, a significant portion of the total LED chip light flux either exits the lamp at high angles from the optical axis or is reflected back into the LED chip and absorbed FIG. 3 shows a number of the design parameters that are important in the construction of an LED illumination lamp. Modern LED chips may be fabricated from GaAs, GaAsP, AlGaAs or other compounds and may use either absorbing or transparent substrates. Many of these chips are capable of emitting a Lambertian distribution of light flux from most, if not all, of the chip surfaces. To minimize input electrical power ($P_{in}$) and to optimize efficiency, the lamp should extract and concentrate substantially all of the light flux rather than just that portion emitted by the LED top surface. In order to meet brightness and angular viewing requirements, such as those shown in FIG. 1, light flux of a certain brightness (B) is concentrated within a specified viewing angle ($theta_v$). In many applications the lamp must provide an illuminated surface having a given area (A) and a specified uniformity of brightness. In addition, it is often necessary to limit the overall height (h) of the lamp because of physical mounting constraints. In a typical illumination application there is no requirement that the LED chip surface be imaged onto the viewing plane.

As shown in FIG. 3, an optimal LED illumination lamp would concentrate all of the light flux from the LED chip to create a maximum brightness, B, within the desired viewing angle, $\theta_v$, and zero brightness elsewhere. The sine-brightness equation, $$(A_c B_c)(\sin^2 \theta_c) \geq (A_v B_v)(\sin^2 \theta_v),$$

relates the area ($A_c$), brightness ($B_c$) and viewing angle ($\theta_c$) at the LED chip to the area ($A_v$), brightness ($B_v$) and viewing angle ($\theta_v$) at the lamp viewing plane.

Figure 4:
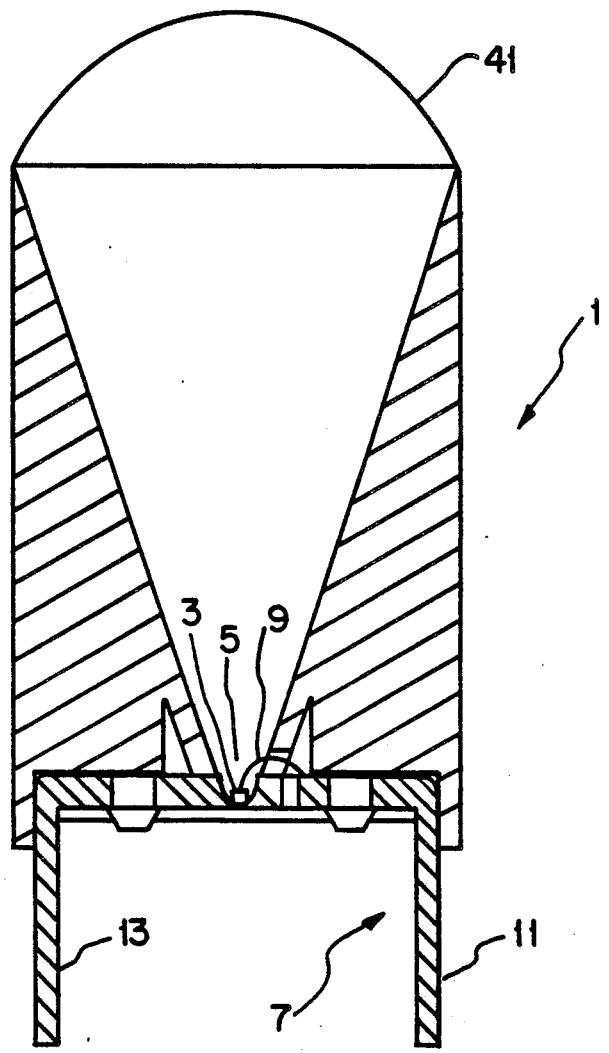
FIG. 4 shows an LED illumination lamp that is constructed in accordance with a preferred embodiment of the present invention.

FIG. 4 shows an LED illumination lamp 1 that is constructed in accordance with a preferred embodiment of the present invention using the principles of non-imaging optics. The lamp is effective to conserve brightness ($B_c = B_v$) and to maximize intensity by cutting off the flux at a desired angle ($\theta_v$). An LED chip 3 sits within a flux extractor cup 5 which is fabricated within a lead frame 7. A bond wire 9 connects the anode of the LED chip 3 to an anode lead 11. The cathode of the LED chip 3 is electrically connected to a cathode lead 13 by conductive epoxy adhesion to the interior surface of the cup 5. Leads 11 and 13 are electrically isolated from each other. The lead frame 7 is fabricated in a conventional manner from a sheet of nickel plated copper. A stripe of silver may be deposited on the sheet in order to allow formation of the cup 5 as is more fully described with reference to FIG. 6. The lead frame 7, after formation of the cup 5, has a thickness of approximately 0.035 inch. The leads 11, 13 may be bent and cut to a given length as desired.

Figure 5:
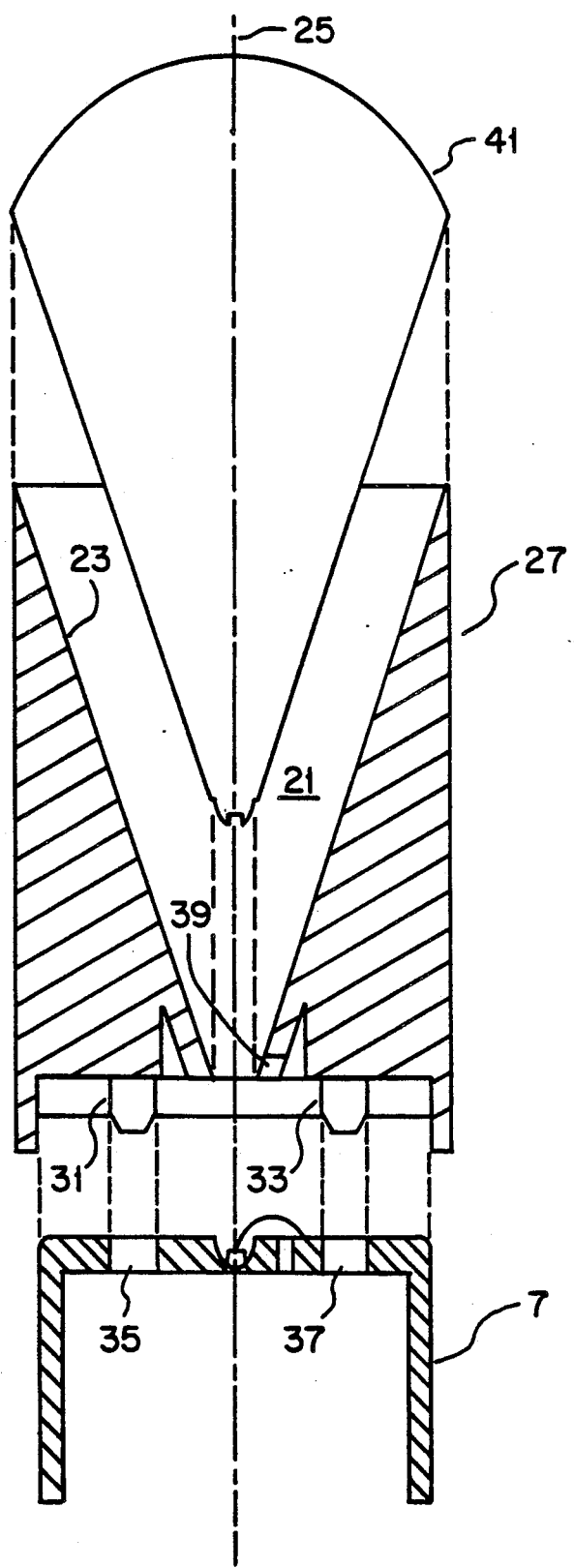
FIG. 5 is an exploded view of the LED illumination lamp shown in FIG. 4.

FIG. 5 shows an exploded view of the lamp 1 shown in FIG. 4. A light pipe 21 is formed by the conical wall 23 of a second stage 27. The bottom opening of the light pipe 21 is slightly larger than the top of the cup 5 to minimize blocking any light exiting the cup 5 caused by misalignment during assembly. The oversize should be kept as small as possible to avoid uniformity problems in the light flux from the lamp 1. The lead frame 7 is attached to the stage 27 by connection of lugs 31, 33 into holes 35, 37 to ensure that the light pipe 21 and the cup 5 are aligned along the optical axis 25. An adhesive may be used to secure lead frame 7 to stage 27 and to minimize light leakage at the interface. A cutout 39 in the wall 23 allows connection of the bond wire 9 from the LED chip 3 to the lead 11.

The second stage 27 may be fabricated from a metallizable plastic such as XHTA-150 which is a commercially available thermoplastic copolymer manufactured by Rohm & Haas Co. The wall 23 is coated with a highly reflective metal such as aluminum or silver and is polished to a bright finish to provide a specularly reflecting surface. The light pipe 21 is 0.813 inches high and the contour of the wall 23 approximates a straight line and is defined by the following table which gives radius (in inches) versus depth (in inches) from the top of the light pipe 21. Alternatively, the wall 23 may have a parabolic contour.

| Depth | Radius |
| --- | --- |
| 0 | .2944 |
| .1976 | .2319 |
| .3456 | .1857 |
| .4349 | .1584 |
| .4987 | .1391 |
| .5488 | .1239 |
| .5905 | .1114 |
| .6263 | .1005 |
| .6575 | .0907 |
| .6849 | .0818 |
| .7090 | .0736 |
| .7301 | .0659 |
| .7484 | .0589 |
| .7639 | .0524 |
| .7771 | .0465 |
| .7886 | .0413 |
| .7986 | .0370 |
| .8067 | .0336 |
| .8127 | .0311 |
| .8169 | .0296 |
| .8186 | .0290 |

A lamp 1 may be constructed as shown in FIG. 4 without the addition of the lens 41 shown in FIGS. 4 and 5 and the light pipe 21 may be air filled for ease of manufacturing and improved thermal performance although the epoxy provides a better optical match to the LED chip 3. One disadvantage of such a lens-less design is that the total height, h, of the lamp 1 is kept relatively large. Addition of the lens 41 to the lamp 1 allowed the total height to be decreased from three inches to 0.813 inch with substantially no change in brightness, $B_v$, and area, $A_v$, and at a constant viewing angle, $\theta_v$, of $\pm 7.5°$.

FIG. 5 shows the immersion lens 41 which may be used with the lamp 1 to decrease total height. Lens 41 is fabricated from an epoxy having an index of refraction of $n = 1.53$ and is available commercially from Essex Polytech Company as "PT" epoxy. The lens 41 has a radius of curvature of 0.4 inch and extends above the top of the second stage 27 a distance of 0.12 inch.

The entire lamp 1 may easily be constructed with reference to FIGS. 4 and 5 by performing the following steps:

1. Attach LED chip 3 inside cup 5 and attach bond wire 9 from the chip 3 to lead 11.
2. Attach lead frame 7 to the second stage 27 with the optical axes aligned.
3. Inject epoxy into the light pipe 21 and the cup 5 and cure.
4. Inject epoxy into a mold cup having the desired shape for lens 41.
5. Attach the mold cup to the top of the second stage 27 ensuring that the optical axes of the lens 41 and the light pipe 21 are aligned
6. Cure the epoxy in the mold cup so that the lens 41 is attached to the epoxy within the light pipe 21 without a reflective interface.
7. Remove the mold cup and finish the surface of lens 41, if desired.

A lamp 1 was constructed as described above using a 16 mil square by 10 mil high absorbing substrate AlGaAs red LED chip 3. The total height of the lamp 1 was approximately one inch and the total diameter was 0.60 inch. Light flux generated by the LED chip 3 was three-dimensional (4 pi sterradian) and the viewing angle relative to the optical axis at the plane of connection of the cup 5 to the second stage 27 was $\pm 60°$. The viewing angle, $\theta_v$, at the viewing plane at the surface of the lens 41 was $\pm 7.5°$ and the illuminated area, $A_v$, was 0.28 square inches. The electrical input power, $P_{in}$, to the LED chip 3 was 40 milliwatts and the brightness, $B_v$, of the lamp 1 was $2.4 \times 10^4$ candela/meter$^2$ (for an intensity of 4.3 candela.

Figure 6:
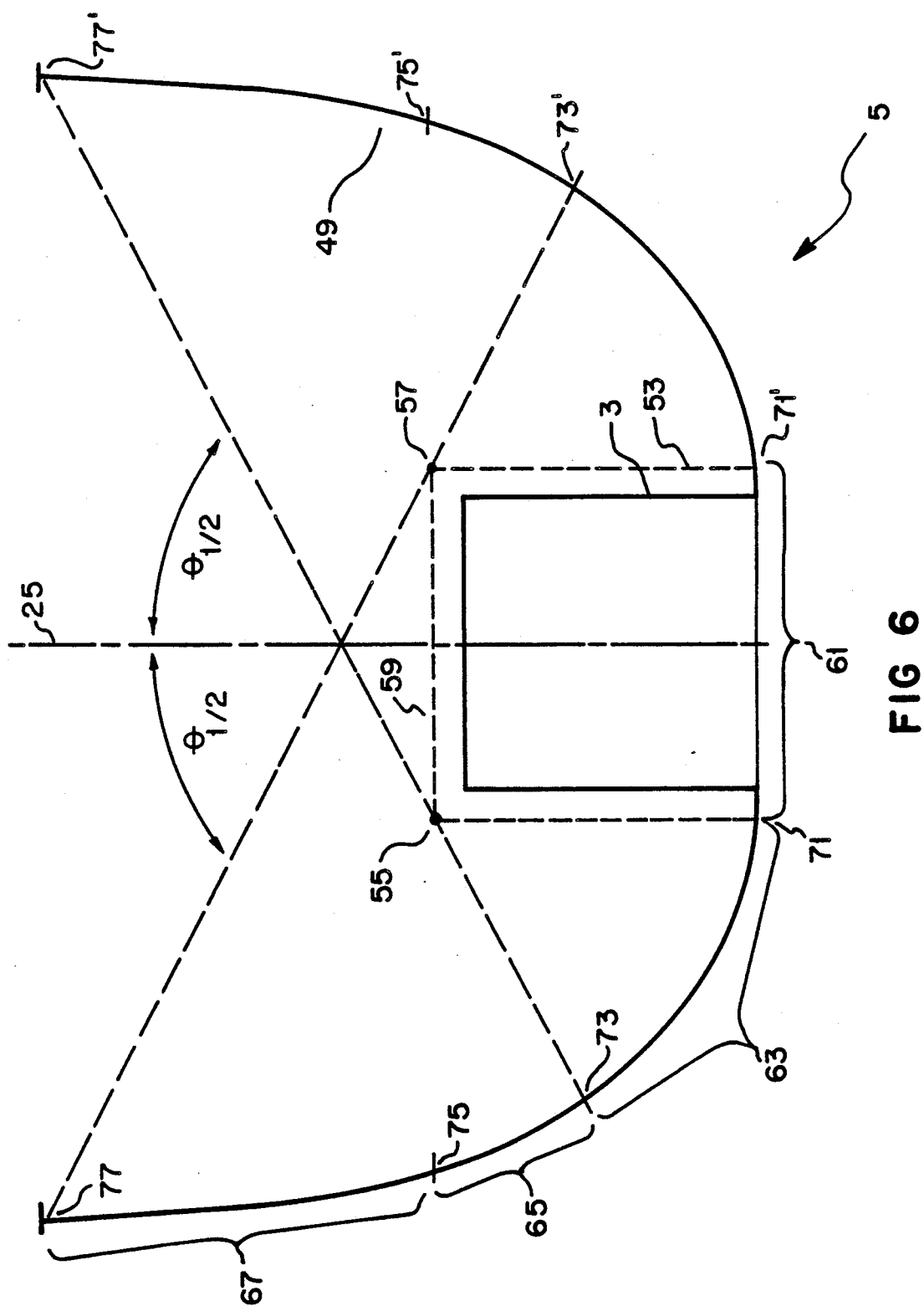
FIG. 6 is a detail view of the flux extractor shown in FIG. 4.

FIG. 6 shows a detailed cross-sectional view of the cup 5 shown in FIGS. 4 and 5. The cup 5 is formed within the lead frame 7 as described above and may be silver coated to provide a specularly reflecting inner surface 49. Light emitted by the LED chip 3 exits the cup 5 within a cup viewing angle theta$_1$ about the optical axis 25. The cup 5 includes four separate sections 61, 63, 65, 67 which are axially symmetric about the optical axis 25. Formation of these four sections is described only with respect to the left half of the cup 5 shown in FIG. 6. Formation of an actual three-dimensional cup 5 could be accomplished by rotation of this planar representation about the optical axis 25. The LED chip 3 is attached to a flat bottom section 61 of the cup 5 using an electrically conductive silver epoxy. The flat bottom section 61 is normal to the optical axis 25 and is slightly larger than the actual dimensions of the LED chip 3 to allow for dimensional tolerances and slight manufacturing misalignment within an envelope 53. In order to avoid discontinuities, the projection of the envelope 53 onto the bottom of the cup 5 is circular even though the actual projection of the LED chip 3 is square. The envelope is cylindrical with a height of the LED chip 3 plus the tolerances and a diameter equal to the width of the LED chip 3 times 1.414 plus the tolerances.

A circular section 63 extends from a point 71 at the edge of flat bottom section 61 to a point 73. This point 73 is determined as the projection of the cup viewing angle through the nearest top edge point 55 of the envelope 53. Between points 71 and 73, the surface of cup 5 forms a segment of a circle having a constant radius and a center at the nearest top edge point 55 of the envelope 53. Since the envelope 53 projection is circular, the section 63 is axially symmetric about the optical axis 25.

A lower parabolic section 65, which is axially symmetric about the optical axis 25, extends from the point 73 to a point 75. The point 75 is located on the inner surface 49 of the cup 5 at the same distance above the flat bottom section 61 as the top surface 59 of the envelope 53. The lower parabolic section 65 is formed as a parabola having its vertex at point 73, its axis projecting through point 73 and near edge point 55, and a focus at the near edge point 55 of the envelope 53.

An upper parabolic section 67, which is also axially symmetric about the optical axis 25, extends from the point 75 to a point 77. The point 77 is determined as the projection of the cup viewing angle through the far edge point 57 onto the inner surface 49 of the cup 5. Thus, the cup viewing angle could be decreased by extending the height of the upper parabolic section 67. The upper parabolic section 67 is formed as a parabola having an axis extending through the far edge point 57 and parallel to the axis of the lower parabolic section 65. The focus of the upper parabolic section 67 is located at the far edge point 57.

Figure 7A:
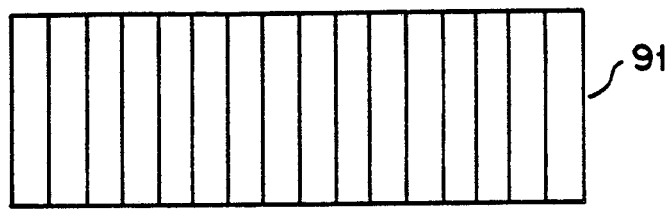
FIGS. 7A-B show a number of lenses that may be used in the lamp shown in FIG. 4.
Figure 7A:
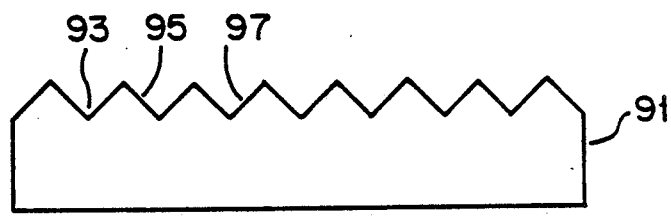
Figure 7B:
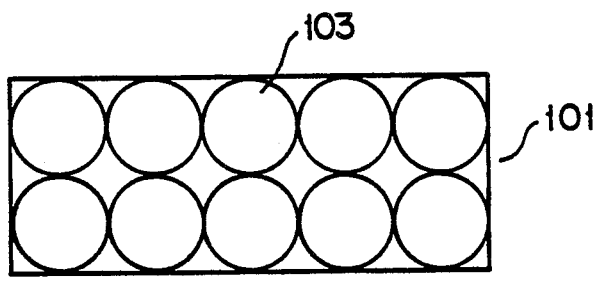
Figure 7B:
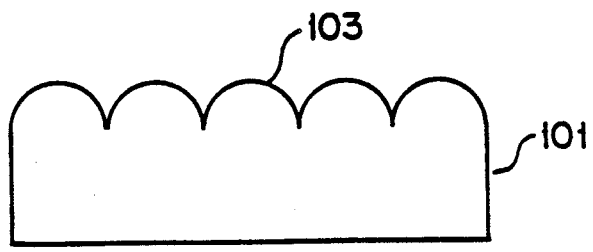

FIGS. 7A–B show two alternative lenses that could be used above the lamp 1 shown in FIG. 4. FIG. 7A shows top and side views of a prism lens 91 that may be used to increase the viewing angle in a single direction, i.e., along a single axis. Prism lens 91 is fabricated from a sheet of optically transmissive material such as 0.200 inch thick acrylic. Triangular grooves 93 at an angle of 5° are cut into the material on, e.g., 100 mil centers, to form the faces 95, 97 of the prism lens 91. Use of the prism lens 91 increases the viewing angle in the direction normal to the direction of the grooves and, at a distance of 25 feet, the human eye is unable to resolve the dark spots produced by the prism lens 91. The actual angular increase was ±2.5°.

FIG. 7B shows top and side views of a fly's eye lens 101 that may be used to increase the viewing angle in two axes. Fly's eye lens 101 is fabricated from a sheet of optically transmissive material such as acrylic and half round domes 103 are formed on the surface of the material. Differential angular increases could be obtained by making the domes 103 elliptical or some other non-circular shape.

FIGS. 8A–C show three types of diffusant that may be used with the lamp 1 shown in FIG. 4. Use of a diffusant causes statistical light scattering and creates a Lambertian light distribution since each diffusant particle acts as a light scattering center and approximates a Lambertian source. Thus, use of a diffusant allows an increase in viewing angle without an increase in brightness variation which may occur with the use of a prism or fly's eye lens.

FIG. 8A shows a bulk diffusant incorporated within the epoxy used to form the light pipe 21 and lens 41 shown in FIG. 4. The bulk diffusant may be made by adding titanium dioxide to the epoxy. Of course, each particle absorbs light and the light loss increases as the amount of diffusant increases. Light loss may approach 50% at an acceptable viewing angle. FIG. 8B shows a diffusant sheet 113 located above the lamp 1. The sheet 113 may be made as a sheet of the same epoxy/titanium dioxide mixture used in FIG. 7A and also creates a Lambertian light distribution at its surface. Since the sheet 113 may be made thin, the amount of light loss may be minimized. FIG. 8C shows a diffusant layer 115 that is fabricated on the surface of the lens 41 and causes only a minimum of light loss. Layer 115 may easily be fabricated by sandblasting lens 41 or by other techniques of roughening or by applying a matte finish to lens 41.

Figure 9:
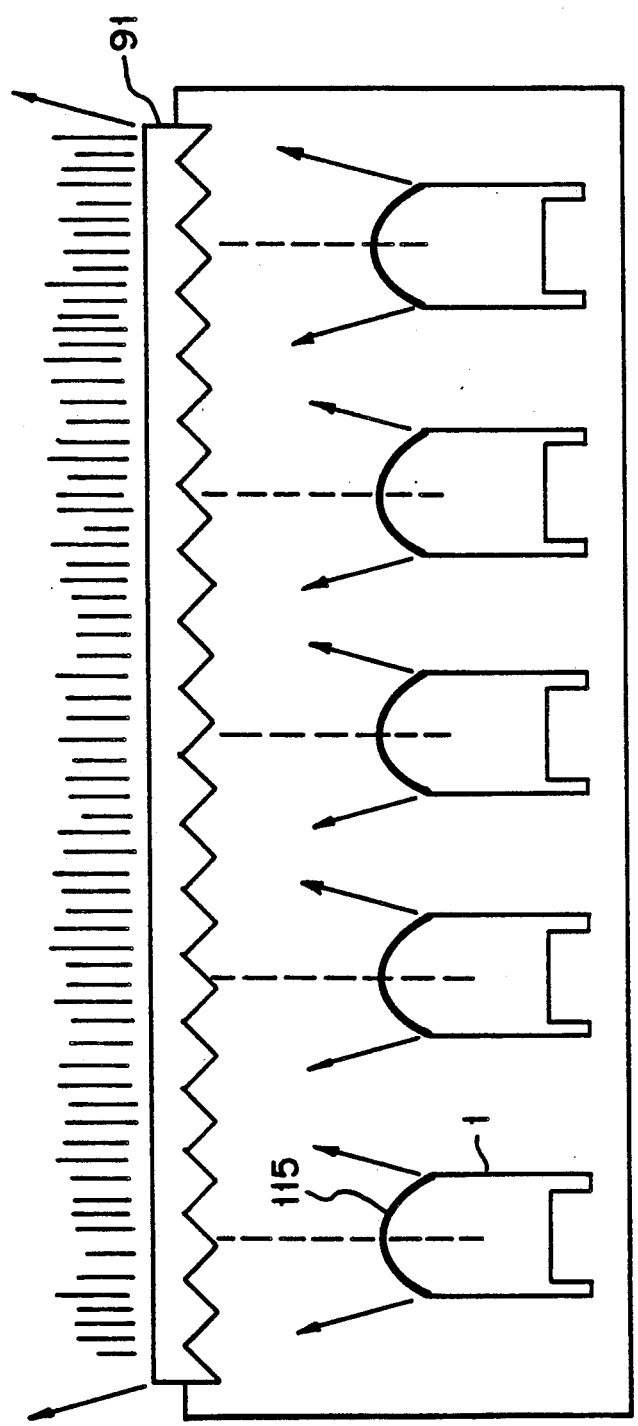
FIG. 9 shows a center high mounted stop light constructed as an array of the lamps shown in FIG. 4.

FIG. 9 shows a portion of a 2×10 array of lamps fabricated on, e.g., a printed circuit board to meet the specification shown in FIG. 1. The viewing angle at each lamp 1 was ±7.5° and the 5° prism lens 91 was used to increase the angle in one axis to ±10°.

We claim:

1. A flux extractor cup for supporting a light source centered on an optical axis within a virtual positioning envelope and for directing light emitted by the source within a solid cup angle of the optical axis, the cup being rotationally symmetric about the optical axis and comprising in cross-section:
    a flat section, located at the bottom of the cup and normal to the optical axis, for attachment of the light source, the flat section having a diameter equal to a diameter of the positioning envelope;
    a circular section, extending from the flat section to a lower point located at an intersection with a projection of the cup angle through a nearest edge point of a top surface of the positioning envelope, the circular section having a constant radius and a center at the nearest edge point;
    a lower parabolic section, extending from the lower point to an upper point located at an intersection with a projection of the top surface of the positioning envelope, the lower parabolic section having a vertex at the lower point, an axis projecting through the nearest edge point and the lower point, and a focus at the nearest edge point; and an upper parabolic section, extending from the upper point to a top point located at an intersection with a projection of the cup angle through a farthest edge point of the top surface of the positioning envelope, the upper parabolic section having a vertex at the top point, an axis extending through the farthest edge point and parallel to the axis of the lower parabolic section, and a focus located at the farthest edge point;

wherein the cup has an interior surface that is specularly reflective such that a substantial portion of the light emitted by the light source in any direction is directed within the solid cup angle.

2. A cup as in claim 1, wherein the cup angle is between ±45° and ±90°.

3. A cup as in claim 2, wherein the light source is an LED.

4. A cup as in claim 3, wherein the cup is fabricated within a metallic lead frame.

5. A cup as in claim 4, wherein the cup has an interior surface that is coated with a layer of silver.

6. A lamp for emitting light within a solid viewing angle of an optical axis, the lamp comprising:
a support frame;
a flux extractor cup connected to the frame and having an exit contour at an exit aperture, the flux extractor cup being centered on, and rotationally symmetric about, the optical axis within a virtual positioning envelope and being operative for supporting a light source and for directing light emitted by the light source through the exit aperture within a solid cup angle of the optical axis; and
a contoured second stage, alignable to the optical axis by attachment to the frame, for receiving the light from the cup at an entrance aperture and for directing the light within a solid second angle less than the cup angle and greater than or equal to the viewing angle;
wherein the second stage entrance aperture is slightly larger than the cup exit aperture such that transition between the cup contour and the second stage contour is smooth and light loss at the transition is small; and
wherein the flux extractor cup comprises in cross section:
a flat section, located at the bottom of the cup and normal to the optical axis, for attachment of the light source, the flat section having a diameter equal to a diameter of the positioning envelope;
a circular section, extending from the flat section to a lower point located at an intersection with a projection of the cup angle through a nearest edge point of a top surface of the positioning envelope, the circular section having a constant radius and a center at the nearest edge point;
a lower parabolic section, extending from the lower point to an upper point located at an intersection with a projection of the top surface of the positioning envelope, the lower parabolic section having a vertex at the lower point, an axis projecting through the nearest edge point and the lower point, and a focus at the nearest edge point; and an upper parabolic section, extending from the upper point to a top point located at an intersection with a projection of the cup angle through a farthest edge point of the top surface of the positioning envelope, the upper parabolic section having a vertex at the top point, an axis extending through the farthest edge point and parallel to the axis of the lower parabolic section, and a focus located at the farthest edge point, and wherein the cup has an interior surface that is specularly reflective such that a substantial portion of the light emitted by the light source is directed within the solid cup angle.

7. A lamp as in claim 6, wherein:
the light source is an LED;
the support frame is a lead frame; and
the cup is fabricated within the lead frame.

8. A lamp as in claim 7, wherein the second stage includes one or more mounting lugs for connection with associated receptors in the lead frame such that the lead frame and second stage are thereby attached and the cup and the second stage are thereby aligned along the optical axis.

9. A lamp as in claim 8, wherein the exit contour of the cup is parabolic and the contour of the second stage is parabolic.

10. A lamp as in claim 8, wherein the exit contour of the cup is parabolic and the contour of the second stage is substantially straight and aligned with the exit contour of the cup.

11. A lamp as in claim 8, wherein:
the cup angle is between ±45° and ±90°;
the second angle is less than the cup angle; and
the viewing angle is less than or equal to the second angle and less than ±10°.

12. A lamp as in claim 8, wherein the second stage is air filled and the lamp further comprises lens attached to the second stage and aligned with the optical axis.

13. A lamp as in claim 8, further comprising an optically transmissive light pipe within the second stage.

14. A lamp as in claim 13, wherein the light pipe comprises a solid filling the second stage and the cup.

15. A lamp as in claim 14, wherein an upper surface of the light pipe is formed into a lens aligned with the optical axis.

16. A lamp as in claim 15, further comprising diffusant particles located within the light pipe such that light striking a particle is scattered.

17. A lamp as in claim 16, wherein the diffusant particles comprise titanium dioxide.

18. A lamp as in claim 15, wherein the lens surface is roughened such that the roughened surface scatters light.

19. A lamp as in claim 15, further including a matte finish on the lens surface such that the matte finish scatters light.

20. A lamp as in claim 18, further comprising a prism lens connected to and over the lens, such that the viewing angle is increased in a first direction.

21. A lamp as in claim 18, further comprising a fly's eye lens connected to and over the lens, such that the viewing angle is increased in first and second orthogonal directions.

* * * * *